United States Patent [19]

Bobb

[11] Patent Number: 4,609,871

[45] Date of Patent: Sep. 2, 1986

[54] TEMPERATURE COMPENSATED OPTICAL FIBER INTERFEROMETRIC MAGNETOMETER

[75] Inventor: Lloyd C. Bobb, Willow Grove, Pa.

[73] Assignee: The United States of America as represented by the Secretary of the Navy, Washington, D.C.

[21] Appl. No.: 627,306

[22] Filed: Jul. 2, 1984

[51] Int. Cl.⁴ ...................... G01R 33/032; G02F 1/09
[52] U.S. Cl. ................................... 324/244; 250/227; 324/225; 350/96.1
[58] Field of Search ................. 324/96, 225, 244, 260; 250/227, 231 R; 350/96.1, 96.29, 374–376

[56] References Cited

U.S. PATENT DOCUMENTS

| | | | |
|---|---|---|---|
| 3,315,160 | 4/1967 | Goodman | 324/73 R |
| 3,488,587 | 1/1970 | Sparrow | 324/97 |
| 3,625,589 | 12/1971 | Snitzer | 350/96.29 |
| 4,147,979 | 4/1979 | Baues et al. | 324/244 |
| 4,267,509 | 5/1981 | Graham | 324/244 |
| 4,442,350 | 4/1984 | Rashleigh | 324/96 X |
| 4,524,322 | 6/1985 | Bobb | 324/96 X |

FOREIGN PATENT DOCUMENTS 0165071  9/1983  Japan .................................. 324/244

OTHER PUBLICATIONS

Koo et al., "Characteristics of Fiber-Optic Magnetic-Field Sensors Employing Metallic Glasses," *Optics Letters*, vol. 7, No. 7, Jul. 1982, pp. 334–336.
Koo et al., "A Fiber-Optic DC Magnetometer," *Journal of Lightwave Technology*, vol. LT-1, No. 3, Sep. 1983, pp. 524, 525.

*Primary Examiner*—Gerard R. Strecker
*Attorney, Agent, or Firm*—Robert F. Beers; Henry Hansen

[57] ABSTRACT

Temperature compensation of an optical fiber interferometer is achieved by wrapping and bonding one fiber arm transversely about the length of a magnetostrictive rod which is sensitive only to the magnetic field component along its length. The other fiber arm is wrapped and bonded about two generally semicircular caps, attached to either end of the rod, in a direction along the longitudinal axis of the rod.

7 Claims, 2 Drawing Figures

TEMPERATURE COMPENSATED OPTICAL FIBER INTERFEROMETRIC MAGNETOMETER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to magnetometers and more particularly to optical fiber interferometric magnetometers having temperature compensation.

It is well known that optical fiber sensors can be utilized in the detection and measurement of magnetic fields. In the typical device, light is directed into the sensor and is split equally into two fiber arms. One arm is merely an optical fiber and, thus, acts as a reference. The other arm, a sensor arm which can be an optical fiber either clad with a magnetostrictive material or wrapped around a magnetostrictive core, is perturbed by the magnetic field of interest.

When the light from these two arms is recombined onto the surface of a detector, the resulting current depends on the light intensity, which in turn depends on the relative phase of the light wave in each arm. As the local magnetic field changes in value, the dimensions and index of refraction of the magnetostrictive arm also change resulting in a phase change which further causes a change in the intensity of the light.

A major problem with these sensors, however, is that small temperature changes in either arm can cause significant changes in the phase of light independent of any magnetic field change. This is because temperature changes cause the length of the arms and their indices of refraction to change, and as a result, temperature fluctuations cannot be readily discerned from magnetic field fluctuations.

For example, for nickel clad silica fibers, it has been shown that the relationship of magnetic field change to temperature change is approximated by the equation: $\Delta T(°C.)=0.25H(Oe)$. This means that a one oersted change in the magnetic field yields the same phase change as a 0.25° C. change in temperature (see Heaton, "Thermal Straining in a Magnetostrictive Optical Fiber Interferometer", *Applied Optics*, Vol. 19, No. 22, Nov. 15, 1980, pp. 3719-3720). Therefore, when measuring very small changes in a magnetic field, correspondingly smaller temperature changes become increasingly significant.

SUMMARY OF THE INVENTION

Accordingly, one purpose and object of the present invention is to provide an interferometric device for measuring the strength of a magnetic field independent of variations in ambient temperature.

Another object of the present invention is to provide a means by which the effects of temperature change upon an optical fiber interferometric magnetometer can be either minimized or eliminated entirely.

Still another object of the present invention is to so configure the two arms of an optical fiber interferometric magnetometer as to accurately measure the strength of very small changes in a magnetic field while simultaneously negating the effects of any change in ambient temperature.

Briefly, these and other objects of the present invention are accomplished by an optical fiber interferometer wherein one fiber arm, the reference arm, is transversely coiled about a magnetostrictive rod which is sensitive only to the variations in the magnetic field components along its length. The rod further includes two generally semicircular caps attached at its ends, and about which the second fiber arm, the sensor arm, is coiled in a direction along the rod's longitudinal axis.

When a magnetic field is applied along the length of the magnetostrictive rod, the rod's length changes depending upon the sign of the magnetostrictive coefficient. At the same time, the radius of the rod will also change such that there is no overall change in the rod's volume when the magnetic field is applied, this being a general characteristic of the magnetostrictive effect. For a reference arm and sensor arm of comparable lengths, therefore, the phase shifts experienced in a magnetic field alone will be of comparable magnitude but of opposite sign and the overall effect will be twice as large as when the reference arm is isolated.

On the other hand, if the temperature of an isotropic magnetostrictive rod changes, for example increases, both the diameter and length of the rod will increase, a distinct difference from the magnetostrictive case where there is no volume change. If the reference arm and sensor arm are of comparable lengths in this case, the phase change in each arm will be comparable; in fact, the fiber lengths may be so adjusted as to make their phase shifts identical thus causing no sign change, due to a temperature change, to be perceived by the detector when the light from both arms is recombined.

Other objects, advantages and novel features of the invention will become apparent from the following detailed description of the invention when considered with the accompanying drawing wherein:

DESCRIPTION OF THE PREFERRED EMBODIMENT

Figure 1:
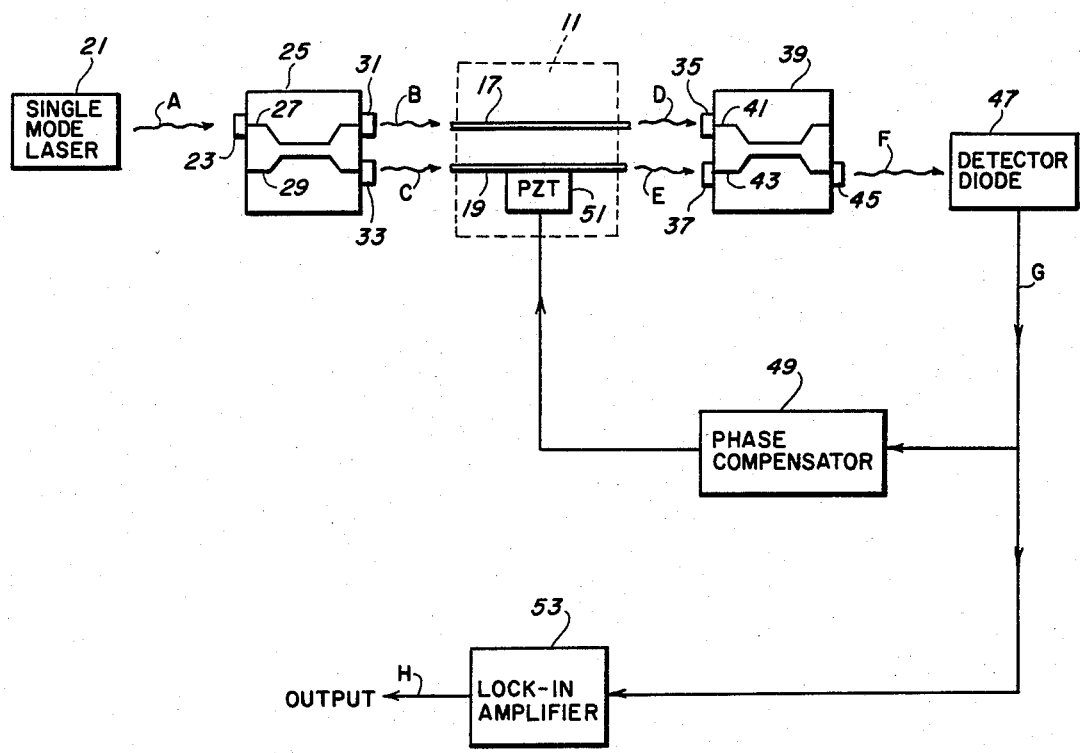
FIG. 1 is a block diagram of an optical fiber magnetometer with temperature compensation according to the invention.

Referring now to FIG. 1, there is shown an optical fiber magnetometer which incorporates a temperature compensated interferometric sensor as will be further described hereinbelow. A single mode laser 21 is optically connected to an input port 23 of a beam-splitting coupler 25. Light from the laser 21, signal A, is distributed to leg 27 and is subsequently coupled to leg 29, exiting therefrom through output ports 31 and 33 as signals B and C respectively.

Figure 2:
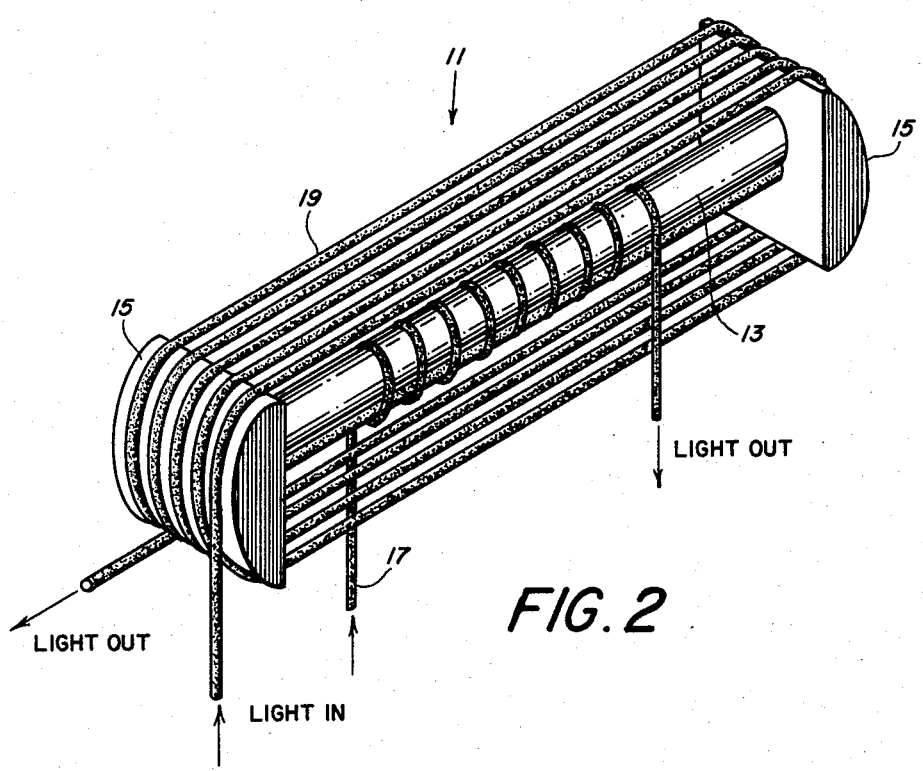
FIG. 2 illustrates a temperature compensated interferometric sensor used in the magnetometer of FIG. 1.

As shown in FIG. 2, the temperature compensated interferometric sensor 11 includes a magnetostrictive rod 13 having two generally convex-shaped caps 15 attached to its ends. While it is desirable to maximize its magnetostrictive coefficient, and at the same time, minimize its temperature coefficient of expansion, rod 13 may be formed from any of the metallic classes, nickel, Permalloy, Permendur, Alfenol, or other suitable magnetostrictive alloys. Furthermore, the magnetostrictive material should be prepared in such a way that it is sensitive only to variations in the magnetic field component along its length. This could be done, for example, by introducing an axial bias field.

One optical fiber 17 is contiguously wound about and bonded to rod 13, while a second optical fiber 19 is wound along the longitudinal axis of rod 13 contiguously about and bonded to caps 15. Both fibers 17 and 19 should have sufficient excess at their free ends to permit optical coupling within an interferometer as will be further described herein.

Alternatively, it should be understood that any embodiment which is dependent upon the volumetric change of the magnetostrictive rod, that is, one in which both the transverse and longitudinal components of a magnetic field are compared, will similarly provide temperature compensation and come within the ambit of the present invention.

Sensor 11 is optically connected to coupler 25 such that signal B is directed through fiber 17 and signal C is directed through fiber 19. Fibers 17 and 19 are further optically connected to input ports 35 and 37, respectively, of a second coupler 39.

Within coupler 39, light signals D and E from fibers 17 and 19, respectively, are recombined, subsequently exiting through an output port 45 as signal F. A detector diode 47 optically connected to output port 45, receives signal F and generates an essentially equivalent current, signal G, indicative of the light's phase and intensity. Alternatively, a four port coupler may be substituted for coupler 39. In this configuration, light signals exiting from two output ports would be received by two individual detector diodes, similar to diode 47, with the essentially equivalent currents being applied to a difference amplifier. The resulting difference signal would then be utilized as described herein below.

Signal G is subsequently applied to a phase compensator 49 which, in conjunction with a lead zirconate titanate (PZT) piezoelectric slab 51 attached to fiber 19, adjusts the phase in fiber 19 in order to maintain quadrature and keep the device operating at maximum sensitivity. It should be understood that any suitable means of maintaining quadrature may be used, and are, thus, within the scope of the present invention. Signal G is also applied to a lock-in amplifier 53 for amplification and further analysis as signal H.

In order to understand the operation of the present invention, consider the case where a silica optical fiber is wrapped and bonded longitudinally about a nickel rod in the manner of fiber 19 and rod 13 in FIG. 2. The phase of light $\phi$ propagating through such a fiber is generally defined by the equation:

$$\phi = (2\pi n L/\lambda) \tag{1}$$

where n is the index of refraction of silica, L is the length of the fiber through which the light has traveled, and $\lambda$ is the wavelength of the light in the fiber.

Due to the magnetostrictive effect, the length of the rod and the fiber bonded thereto will change. Concomitantly, strain changes induced by any change in length will also cause a change in the refractive index of the fiber due to the photoelastic effect. Therefore, changes in both length $\Delta L$ and refractive index $\Delta n$ will introduce a phase delay $\Delta \phi$ in the light propagated through the isotropic fiber, such that:

$$\Delta \phi = \frac{2\pi n L}{\lambda} \left( \frac{\Delta L}{L} + \frac{\Delta n}{n} \right) \tag{2}$$

Furthermore, the effect of recoverable strain can be described by the photoelastic tensor, where:

$$\Delta \left( \frac{1}{n^2} \right)_i = P_{ij}\epsilon_j \tag{3}$$

Assuming that $\epsilon_1$ and $\epsilon_2$ refer to perpendicular but transverse strains in the fiber, while $\epsilon_3$ is the strain along the fiber's length, and further assuming that there is no volume change during magnetostriction (i.e., $\epsilon_1 = \epsilon_2 = -\epsilon_3/2$), equation (3) becomes:

$$\Delta \left( \frac{1}{n^2} \right)_1 = P_{11}\epsilon_1 + P_{12}\epsilon_2 + P_{13}\epsilon_3 \tag{4}$$

$$\Delta \left( \frac{1}{n^2} \right)_2 = P_{21}\epsilon_1 + P_{22}\epsilon_2 + P_{23}\epsilon_3 \tag{5}$$

$$\Delta \left( \frac{1}{n^2} \right)_3 = P_{31}\epsilon_1 + P_{32}\epsilon_2 + P_{33}\epsilon_3 \tag{6}$$

For isotropic silica, $P_{11} = P_{22} = P_{33}$, and $P_{12} = P_{13} = P_{21} = P_{23} = P_{31} = P_{32}$; therefore, equations (4), (5) and (6) respectively become:

$$\Delta \left( \frac{1}{n^2} \right)_1 = (P_{11} + P_{12})\epsilon_1 + P_{12}\epsilon_3 \tag{7}$$

$$\Delta \left( \frac{1}{n^2} \right)_2 = (P_{11} + P_{12})\epsilon_1 + P_{12}\epsilon_3 \tag{8}$$

$$\Delta \left( \frac{1}{n^2} \right)_3 = 2P_{12}\epsilon_1 + P_{11}\epsilon_3 \tag{9}$$

From the above equations (7) through (9), it can be seen that:

$$\frac{\Delta n_1}{n_1} = \frac{\Delta n_2}{n_2} = \frac{-n^2}{2} [(P_{11} + P_{12})\epsilon_1 + P_{12}\epsilon_3] \tag{10}$$

Because the nickel rod is much larger in cross-section than the optical fiber, it can be assumed that the strain in the silica fiber will be dominated by the expansion or contraction of the nickel rod. Moreover, it is assumed that when the silica fiber is stretched, its cross-sectional area decreases. Therefore, equation (10) becomes:

$$\frac{\Delta n_1}{n_1} = \frac{\Delta n_2}{n_2} = -\frac{n^2}{2} \left( \frac{P_{12}}{2} \epsilon_3 - \frac{P_{11}}{2} \epsilon_3 \right) \tag{11}$$

or $$\frac{\Delta n_1}{n_1} = \frac{\Delta n_2}{n_2} = -\frac{n^2}{4} \alpha \Delta T (P_{12} - P_{11}) \tag{12}$$

where $\alpha$ is the temperature coefficient of expansion of nickel ($13 \times 10^{-6}$/°C.) and $\Delta T$ is the change in temperature.

Equation (12) relates the change in the index of refraction of the silica optical fiber to the strain experienced therein. To account for the temperature changes in the silica itself, one must add the temperature coefficient of the index of refraction to equation (12), thus giving:

$$\frac{\Delta n}{n} = -\frac{n^2}{4} \alpha \Delta T(P_{12} - P_{11}) + \frac{1}{n} \frac{\partial n}{\partial T} \Delta T \quad (13)$$

Where the length change in the optical fiber is described by the equation:

$$(\Delta L/L) = \alpha \Delta T \quad (14)$$

and where $$\beta = \frac{1}{n} \frac{\partial n}{\partial T} \Delta T \, (6.85 \times 10^{-6}/°C.$$

for silica), the phase delay $\Delta\phi$ described by equation (2) becomes:

$$\Delta\phi = \frac{2\pi nL}{\lambda} \Delta T \left\{ \alpha \left[ 1 - \frac{n^2}{4}(P_{12} - P_{11}) \right] + \beta \right\} \quad (15)$$

Equation (15) describes the change in phase of transversely polarized light exiting an optical fiber of length L which is wrapped and bonded longitudinally about a nickel rod in the manner of fiber 19 and rod 13 in FIG. 2, and wherein the fiber and rod experience and change in temperature $\Delta T$.

If one assumes further that the nickel rod above has an additional silica optical fiber wrapped and bonded transversely in the manner of fiber 17 and rod 13 in FIG. 2, and that the same wavelength of light is directed through both fibers, equation (15) may be rewritten as:

$$\Delta\phi = KL_i \Delta T \{\alpha_i(\rho) + \beta\} \quad (16)$$

where it is also assumed that the two fibers are different in length and the temperature coefficient of expansion is not the same in the radial direction as in the longitudinal direction (NOTE: for an isotropic material, $\alpha$ is the same in all directions).

If the two fibers are arms of an interferometer, it is desirable to have the phase shifts in each arm due to the change in temperature be identical. If this can be arranged, then there is no signal associated with temperature drift. Under these conditions, $\Delta\phi_1 = \Delta\phi_2$, or:

$$KL_1 \Delta T(\alpha_1 + \beta) = KL_2 \Delta T(\rho_2 + \beta); \quad (17)$$

solving for length, $$\frac{L_1}{L_2} = \frac{\alpha_2 \rho + \beta}{\alpha_1 \rho + \beta}. \quad (18)$$

Therefore, it can be seen from equation (18) that the temperature drift can be balanced out of an optical fiber interferometer by adjusting the lengths of the arms even where the temperature coefficient of expansion is different radially and longitudinally. If $\alpha_1 = \alpha_2$, then $L_1 = L_2$ as expected. The efficacy of this approach, however, will depend on how well the arms can be balanced and to what extent they experience the same thermal fluctuations.

It remains at this point to calculate the phase change in both arms due to the magnetostrictive effect. In order for this system to operate as desired, the phase change under magnetostriction must not be identical in both arms. For purposes of this calculation, it is assumed that the strain in the fiber arises from magnetostriction in the nickel rod, and that the magnetic field is along the length of the rod. In this case, equation (2) becomes:

$$\Delta\phi = \frac{2\pi nL}{\lambda} \left\{ \epsilon_3 - \frac{n^2}{2} [(P_{11} + P_{12})\epsilon_1 + P_{12}\epsilon_3] \right\} \quad (19)$$

where $\Delta L/L = \epsilon_3 = \gamma H_1$. For a bias field of 3 Oe, $\gamma = 2.9 \times 10^{-6}$ for nickel, and $H_1$ is the variation of the magnetic field about the bias field value. Assuming again that there is no volume change during the magnetostriction (i.e., $\epsilon_1 = \epsilon_2 = -\epsilon_3/2$), equation (19) may be expressed as:

$$\Delta\phi = \frac{2\pi nL}{\lambda} \epsilon_3 \left[ 1 - \frac{n^2}{4}(P_{12} - P_{11}) \right] \quad (20)$$

In the above equation (20), $\epsilon_3$ refers to the change in length of the optical fiber which is bonded longitudinally to the rod. The fiber which is wrapped transversely about the rod, however, will also change in length. Because there is no volume change under magnetostriction, the radius of the rod will change in the opposite sense as the length change. Therefore, the relationship $\epsilon_1 = \epsilon_2 = -\epsilon_3/2$ also represents the strain in the rod under magnetostriction. If the longitudinal strain in the transversely wrapped fiber is designated $\epsilon_3^T$, and assuming $\epsilon_3^T = -\epsilon_3/2$, one finds that:

$$\Delta\phi^T = (-\tfrac{1}{2}) \frac{2\pi nL}{\lambda} \epsilon_3 \left[ 1 - \frac{n^2}{4}(P_{12} - P_{11}) \right] \quad (21)$$

Thus, by comparing equations (20) and (21), it can be appreciated that because the phase change increases in one arm while decreasing in the other, any signal resulting from mixing the light waves from the two arms will be larger than in the case where one arm is isolated.

Therefore, it is now apparent that an optical fiber interferometer may be compensated for temperature variations by wrapping and bonding one fiber arm transversely about the length of a magnetostrictive rod which is sensitive only to the magnetic field component along its length and by wrapping and bonding the other fiber arm longitudinally about the rod.

Obviously many modifications and variations of the present invention are possible in light of the above teachings. It is therefore to be understood that within the scope of the appended claims the invention may be practiced otherwise than as specifically described.

What is claimed is:

1. An interferometric device for measuring the strength of a magnetic field independent of variations in ambient temperature, comprising:
   a source of coherent light signals;
   means, optically coupled to said source, for splitting the light signals therefrom into two subsignals of equal amplitude, frequency, and phase;
   a magnetostrictive rod adapted to be sensitive to variations only in the magnetic field component along its length;

a first optical fiber coiled and bonded contiguously and transversely about said rod, and optically coupled at one end to receive one subsignal from said splitting means;

two convex caps, each attached to the ends of said rod;

a second optical fiber coiled and bonded contiguously about said caps in a direction along the longitudinal axis of said rod, and optically coupled at one end to receive the second subsignal from said splitting means;

means, optically coupled to the other end of said first and second fiber, for recombining the subsignals therefrom into a signal the intensity of which varies in proportion to the magnetic field of interest;

photodetector means, optically coupled to said recombining means, for receiving the recombined signal and converting it into a substantially equivalent electrical signal; and processing means, connected to said photodetector means, for determining the strength of the magnetic field.

2. An interferometric device according to claim 1, further comprising feedback means, coupled between the output of said photodetector means and said first fiber, for actively maintaining phase quadrature.

3. An interferometric device according to claim 2, wherein said feedback means comprises:

a phase compensator; and piezoelectric means, contiguously attached to said first fiber, for adjusting the phase of the subsignal therein.

4. An interferometric device according to claim 1, wherein said source is a single-mode laser.

5. An interferometric device according to claim 4, wherein said rod is sensitized through exposure to an axial bias field.

6. An interferometric device according to claim 5, wherein said splitting means is a beam-splitting coupler having one input port and two output ports.

7. An interferometric device according to claim 6, wherein said recombining means is a coupler having two input ports and one output port.

* * * * *